(12) United States Patent
Choi

(10) Patent No.: US 11,183,535 B2
(45) Date of Patent: Nov. 23, 2021

(54) DISPLAY DEVICE

(71) Applicant: Samsung Display Co., Ltd., Yongin-si (KR)

(72) Inventor: Tae Hyeok Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 220 days.

(21) Appl. No.: 16/169,483

(22) Filed: Oct. 24, 2018

(65) Prior Publication Data

US 2019/0237508 A1    Aug. 1, 2019

(30) Foreign Application Priority Data

Jan. 31, 2018   (KR) ........................ 10-2018-0012437

(51) Int. Cl.
| | |
|---|---|
| *H01L 27/15* | (2006.01) |
| *H01L 33/38* | (2010.01) |
| *G09G 3/32* | (2016.01) |
| *H01L 27/32* | (2006.01) |

(52) U.S. Cl.
CPC ............ *H01L 27/156* (2013.01); *G09G 3/32* (2013.01); *H01L 33/382* (2013.01); *G09G 2300/0426* (2013.01); *H01L 27/3276* (2013.01)

(58) Field of Classification Search
CPC ............... H01L 27/326; H01L 27/3262; H01L 27/3265

See application file for complete search history.

(56) References Cited

U.S. PATENT DOCUMENTS

| | | | |
|---|---|---|---|
| 2006/0138922 A1* | 6/2006 | Kim | .................. H01L 29/78621 313/11 |
| 2011/0316007 A1* | 12/2011 | Sagawa | ............... H01L 27/3246 257/88 |
| 2013/0270526 A1* | 10/2013 | Kim | ..................... H01L 27/1218 257/40 |
| 2014/0091331 A1 | 4/2014 | Ning et al. | |
| 2014/0361290 A1* | 12/2014 | Yamazaki | .......... H01L 27/1251 257/43 |
| 2017/0243932 A1* | 8/2017 | Ohara | .................. H01L 51/5012 |
| 2017/0317299 A1* | 11/2017 | Choi | ................... H01L 27/3276 |
| 2017/0338253 A1* | 11/2017 | Sato | ..................... H01L 27/1255 |
| 2018/0040837 A1* | 2/2018 | Seo | ...................... H01L 27/3262 |
| 2018/0188575 A1* | 7/2018 | Kosaka | ............. G02F 1/136227 |
| 2018/0190934 A1* | 7/2018 | Choi | ................... H01L 51/5228 |
| 2018/0358573 A1* | 12/2018 | Maeda | ............... H01L 51/5036 |
| 2019/0067403 A1* | 2/2019 | Song | ................. H01L 29/78633 |

FOREIGN PATENT DOCUMENTS

| | | |
|---|---|---|
| KR | 10-1366162 B1 | 2/2014 |
| KR | 10-2017-0023271 A | 3/2017 |
| KR | 10-2017-0074625 A | 6/2017 |

* cited by examiner

*Primary Examiner* — Bac H Au
(74) *Attorney, Agent, or Firm* — Kile Park Reed & Houtteman PLLC

(57) ABSTRACT

A display device includes a substrate including a first recess portion, a semiconductor layer that overlaps the first recess portion, the semiconductor layer including protrusions and depressions conforming to a shape of the first recess portion, and a gate electrode that overlaps the first recess portion and the semiconductor layer, the gate electrode including protrusions and depressions conforming to the shape of the first recess portion. A thickness of the substrate in the first recess portion is less than a thickness of the substrate in a non-recess portion, excluding the first recess portion.

21 Claims, 6 Drawing Sheets

DISPLAY DEVICE

CROSS-REFERENCE TO RELATED APPLICATION

Korean Patent Application No. 10-2018-0012437 filed on Jan. 31, 2018, in the Korean Intellectual Property Office, and entitled: "Display Device," is incorporated by reference herein in its entirety.

BACKGROUND

1. Field

Embodiments relate to a display device, for example, a display device that includes a light emitting diode.

2. Description of the Related Art

Each of a plurality of pixels included in a display device may include a light emitting diode such as an organic light emitting diode or an inorganic light emitting diode. The light emitting diode includes a hole injection electrode, an electron injection electrode, and an emission layer that is disposed between the hole injection electrode and the electron injection electrode, and holes and electrons injected into the emission layer from the hole injection electrode and electron injection electrode, respectively, generate an exciton by being coupled with each other, and light is emitted when the exciton falls from an excited state to a ground state.

The above information disclosed in this Background section is only for enhancement of understanding of the background of the invention and therefore it may contain information that does not form the prior art that is already known in this country to a person of ordinary skill in the art.

SUMMARY

Embodiments are directed to a display device including a substrate including a first recess portion, a semiconductor layer that overlaps the first recess portion, the semiconductor layer including protrusions and depressions conforming to a shape of the first recess portion, and a gate electrode that overlaps the first recess portion and the semiconductor layer, the gate electrode including protrusions and depressions conforming to the shape of the first recess portion. A thickness of the substrate in the first recess portion is less than a thickness of the substrate in a non-recess portion, excluding the first recess portion.

The display device may further include a light emitting diode. The semiconductor layer and the gate electrode may form a driving transistor that controls an amount of a current flowing to the light emitting diode.

The semiconductor layer may include a first end and a second end that are spaced apart from each other, and a channel region that is located between the first end and the second end. The channel region may include protrusions and depressions having vertical portions and a horizontal portion, the vertical portions and horizontal portion conforming to the shape of the first recess portion.

A channel length of the driving transistor may correspond to a length of the vertical portions and a length of the horizontal portion of the channel region.

The display device may further include a second recess portion in the substrate, a first electrode that overlaps the second recess portion, the first electrode including protrusions and depressions conforming to a shape of the second recess portion, and a second electrode that overlaps the second recess portion and faces the first electrode, the second electrode including protrusions and depressions conforming to the shape of the second recess portion.

The first electrode and the second electrode may form a storage capacitor that maintains a gate voltage of the driving transistor.

The first electrode and the second electrode may respectively include protrusions and depressions having vertical portions and horizontal portion conforming to the shape of the second recess portion. The storage capacitor may have a capacitance that corresponds to a length of the vertical portions and a length of the horizontal portion.

The display device may further include a second electrode that overlaps the first recess portion, the semiconductor layer, and the gate electrode. The gate electrode and the second electrode may form a storage capacitor that maintains a gate voltage of the driving transistor.

The gate electrode and the second electrode may respectively include protrusions and depressions having vertical portions and horizontal portion conforming to the shape of the first recess portion. The storage capacitor may have a capacitance that corresponds to a length of the vertical portions and a length of the horizontal portion.

Embodiments are also directed to a display device including a substrate including a recess portion, a first electrode that overlaps the recess portion, the first electrode including protrusions and depressions conforming to a shape of the recess portion, and a second electrode that overlaps the recess portion and faces the first electrode, the second electrode including protrusions and depressions conforming to the shape of the second recess portion, and an insulation layer that is between the first electrode and the second electrode. A thickness of the substrate in the recess portion is less than a thickness of the substrate in a non-recess portion, excluding the recess portion.

The display device may further include a light emitting diode and a driving transistor that controls an amount of a current flowing to the light emitting diode. The first electrode and the second electrode may form a storage capacitor that maintains a gate voltage of the driving transistor.

The first electrode and the second electrode may respectively include protrusions and depressions having vertical portions and horizontal portion conforming to the shape of the recess portion. Capacitance of the storage capacitor may correspond to a length of the vertical portions and a length of the horizontal portion.

The display device may further include an additional recess portion formed in the substrate and a semiconductor layer that overlaps the additional recess portion, the semiconductor layer including protrusions and depressions conforming to a shape of the additional recess portion, and a gate electrode that overlaps the additional recess portion and the semiconductor layer and forms protrusions and depressions conforming to the shape of the additional recess portion. The semiconductor layer may include a first end and a second end that are spaced apart from each other, and a channel region that is located between the first end and the second end. The semiconductor layer and the gate electrode may form a driving transistor that controls an amount of a current flowing to a light emitting diode.

The channel region may include protrusions and depressions having vertical portions and a horizontal portion conforming to the shape of the additional recess portion. A channel length of the driving transistor may correspond to a length of the vertical portions and a length of the horizontal portion of the channel region.

Embodiments are also directed to display device including a substrate, a first recess portion in the substrate, a light emitting diode on the substrate, and a driving transistor that includes a channel region overlapping the first recess portion and that controls an amount of a current flowing to the light emitting diode. A thickness of the substrate in the first recess portion is less than a thickness of the substrate in a non-recess portion, excluding the first recess portion.

A channel region of the driving transistor may include vertical portions and a horizontal portion that conform to the shape of the first recess portion. A channel length of the driving transistor may correspond to a length of the vertical portions and a length of the horizontal portion.

The display device may further include a second recess portion in the substrate; and a storage capacitor that includes a first electrode and a second electrode overlapping the second recess portion. The storage capacitor may maintain a gate voltage of the driving transistor.

Each of the first electrode and the second electrode may include vertical portions and a horizontal portion conforming to a shape of the second recess portion. Capacitance of the storage capacitor may correspond to a length of the vertical portions and a length of the horizontal portion.

The display device may further include a storage capacitor that overlaps the first recess portion and the driving transistor.

A gate electrode of the driving transistor may be shared as a first electrode of the storage capacitor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
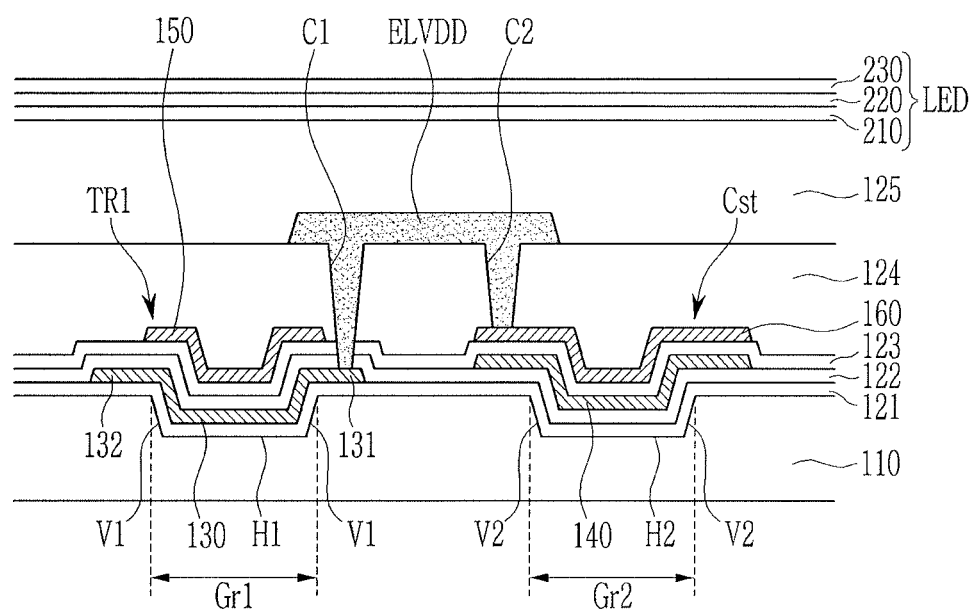
FIG. 1 illustrates a cross-sectional view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of a display device according to an exemplary embodiment. Referring to FIG. 1, a display device may include a display area that displays an image and a peripheral area that is disposed at the periphery of the display area. A plurality of pixels that emit light may be disposed in the display area.

Each of plurality of pixels may include a light emitting diode LED, a driving transistor TR1 that controls a current flowing to the light emitting diode LED, and a storage capacitor Cst that maintains a gate voltage of the driving transistor TR1. The driving transistor TR1 and the storage capacitor Cst may be disposed on a substrate 110.

The substrate 110 may include suitable materials such as an insulation material such as glass, plastic, and the like, or a metal. According to an exemplary embodiment, the substrate 110 may be made of a flexible material so as to be bendable, foldable, or rollable. In some implementations, the substrate 110 may be made of ultrathin glass, metal, or plastic.

The substrate 110 may include a first recess portion Gr1 that is in an overlapping relationship with the driving transistor TR1 and a second recess portion Gr2 that is in an overlapping relationship with the storage capacitor Cst.

The first recess portion Gr1 may include a first horizontal portion H1 and a first vertical portions V1. The first horizontal portion H1 may be a portion that is formed substantially in a horizontal direction at a location that is lower than an upper surface of the substrate 110, excluding the first recess portion Gr1 and the second recess portion Gr2. Hereinafter, the term "upper surface of the substrate 110" refers to a portion of one side of the substrate 110, excluding the first recess portion Gr1 and the second recess portion Gr2, and the term "horizontal direction" refers to a direction that is parallel with the one side of the substrate 110. The upper surface of the substrate 110 may be referred to as a non-recess portion. The first vertical portions V1 may be a portion that connects the upper surface of the substrate 110 and the first horizontal portion H1 substantially in a perpendicular direction. A thickness of the substrate 110 in the first recess portion Gr1 may be less than a thickness of the substrate 110 in the non-recess portion. The second recess portion Gr2 may include a second horizontal portion H2 and second vertical portions V2. The second horizontal portion H2 may be a portion that is formed substantially in a horizontal direction at a location that is lower than the upper surface of the substrate 110, and the second vertical portions V2 may be a portion that connects the upper surface of the substrate 110 and the second horizontal portion H2 substantially in a vertical direction. A thickness of the substrate 110 in the second recess portion Gr2 may be less than a thickness of the substrate 110 in a non-recess portion.

Herein, the description that the vertical portions connect the upper surface of the substrate and the horizontal portion H1 substantially in a perpendicular direction may be interpreted liberally with consideration to manufacturing imprecision.

A buffer layer 121 may be disposed on the substrate 110. The buffer layer 121 may help to prevent permeation of an undesirable component such as an impurity element or moisture. The buffer layer 121 may include protrusions and depressions conforming to the shape of each of first recess portion Gr1 and second recess portion Gr2. The buffer layer 121 may be omitted depending on a type and a process condition of the substrate 110.

A semiconductor layer 130 that includes amorphous silicon, polysilicon, or an oxide semiconductor may be disposed on the buffer layer 121. The semiconductor layer 130 may overlap the first recess portion Gr1. The semiconductor layer 130 may be formed to be wider than the first recess portion Gr1 in the horizontal direction. A portion of the semiconductor layer 130 may be disposed on the first recess portion Gr1 and another portion of the semiconductor layer 130 may be disposed on the non-recess portion. The semiconductor layer 130 may include protrusions and depressions conforming to a shape of the first recess portion Gr1. A first end 131 and a second end 132 of the semiconductor layer 130, disposed apart from each other, may be impurity-doped to provide conductivity. A channel region may be disposed between the first end 131 and the second end 132. The channel region of the semiconductor layer 130 may include protrusions and depressions that have vertical portions and a horizontal portion conforming to the shape of the first recess portion Gr1.

A first insulation layer 122 may be disposed on the semiconductor layer 130 and the buffer layer 121. The first insulation layer 122 may be a single layer such as a silicon nitride, a silicon oxide, and the like, or a double layer of a silicon nitride and a silicon oxide.

A first conductive layer may be disposed on the first insulation layer 122. The first conductive layer may include a first electrode 140 that overlaps the second recess portion Gr2. The first electrode 140 may be formed wider than the second recess portion Gr2 in the horizontal direction. A part of the first electrode 140 may be disposed on the second recess portion Gr2 and another part may be disposed on the non-recess portion. The first electrode 140 may form protrusions and depressions that have vertical portions and horizontal portion conforming to the shape of the second recess portion Gr2. The first electrode 140 may have a single-layered or a multi-layered structure including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A second insulation layer 123 may be disposed on the first conductive layer and the first insulation layer 122. The second insulation layer 123 may be in a form of a single layer such as a silicon nitride, a silicon oxide, and the like, or a double layer of a silicon nitride and a silicon oxide.

A second conductive layer may be disposed on the second insulation layer 123. The second conductive layer may include a gate electrode 150 that overlaps the first recess portion Gr1 and a second electrode 160 that overlaps the second recess portion Gr2.

The gate electrode 150 may include protrusions and depressions that have vertical portions and horizontal portion conforming to the shape of the first recess portion Gr1. The gate electrode 150 may overlap the channel region of the semiconductor layer 130, and the semiconductor layer 130 and the gate electrode 150 may form a driving transistor TR1. The gate electrode 150 does not need to be wider than the first recess portion Gr1 in the horizontal direction. However, depending on exemplary embodiments, the gate electrode 150 may be formed to be wider than the first recess portion Gr1 in the horizontal direction. A part of the gate electrode 150 may be disposed on the first recess portion Gr1 and the other part may be disposed on the non-recess portion.

When the channel region of the semiconductor layer 130 includes protrusions and depressions having vertical portions and horizontal portion conforming to the shape of the first recess portion Gr1, a length of a channel of the driving transistor TR1 may be increased by an amount corresponding to a length of a first vertical portions V1 of the first recess portion Gr1. For example, if the substrate 110 were to not include the first recess portion Gr1, the channel length of the driving transistor TR1 would be substantially equal to a length of a first horizontal portion 111. However, as previously described, when the substrate 110 includes the first recess portion Gr1 and the channel of the driving transistor TR1 is disposed to overlap the first recess portion Gr1, the length of the channel of the driving transistor TR1 may be increased corresponding to a length of each of first vertical portions V1 disposed at opposite sides of the first horizontal portion H1. For example, the channel length of the driving transistor TR1 may correspond to the length of the vertical portions plus the length of the horizontal portion of the semiconductor layer 130.

When the channel length of the driving transistor TR1 is increased, a driving range of the driving transistor TR1 may be increased. The term "driving range of the driving transistor TR1" refers to a range within which the driving transistor TR1 can control a current flow to the light emitting diode LED. The driving range may be represented as a range of a gate voltage corresponding to a maximum amount and a minimum amount of a current that can be flowed by the driving transistor TR1. When the driving range of the driving transistor TR1 is increased, a luminance range of the light emitting diode LED is increased, and accordingly, a range of color expression of the display device may be increased.

The second electrode 160 may include protrusions and depressions having vertical portions and horizontal portion conforming to the shape of the second recess portion Gr2. The second electrode 160 may face the first electrode 140, with the second insulation layer 123 interposed therebetween. The first electrode 140 and the second electrode 160 may form a storage capacitor Cst. It is not necessary that the second electrode 160 be formed to be wider than the second recess portion Gr2 in the horizontal direction. However, depending on exemplary embodiments, a part of the second electrode 160 may be formed wider than the second recess portion Gr2 in the horizontal direction, and another part may be disposed on an upper surface of the substrate 110. The second electrode 160 may be in a form of a single-layered or a multi-layered structure including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

When the first electrode 140 and the second electrode 160 respectively include protrusions and depressions having vertical portions and horizontal portion conforming to the shape of the second recess portion Gr2, the area of the storage capacitor Cst may be widened by an amount corresponding to the length of the second vertical portions V2 of the second recess portion Gr2. For example, compared to a case that the substrate 110 does not include the second recess portion Gr2, the area of the storage capacitor Cst may be widened corresponding to the length of each of the second vertical portions V2 disposed at opposite sides of the second horizontal portion H2.

Capacity of a capacitor is proportional to the area of the capacitor. Accordingly the capacity of the storage capacitor Cst may be increased as the area of the storage capacitor Cst is widened. For example, the capacity of the storage capacitor Cst may correspond (i.e., may be proportionate) to the length of the vertical portions and the length of the horizontal portion formed by each of the first electrode 140 and the second electrode 160. When the capacity of the storage capacitor Cst is increased, a gate voltage of the driving transistor TR1 can be more strongly maintained, such that the display device may emit light more stably.

A third insulation layer 124 may be disposed on the gate electrode 150, the second electrode 160, and the second insulation layer 123. The third insulation layer 124 may be in a form of a single layer of a silicon nitride, a silicon oxide, or the like, or may be a double layer of a silicon nitride and a silicon oxide.

A third conductive layer may be disposed on the third insulation layer 124. The third conductive layer may include a power line ELVDD. A first contact hole C1 may overlap one end of the semiconductor layer 130. The first contact hole C1 may penetrate the first insulation layer 122, the second insulation layer 123, and the third insulation layer 124. A second contact hole C2 may overlap one end of the second electrode 160. The second contact hole C2 may penetrate the third insulation layer 124. The power line ELVDD may contact a first end 131 of the semiconductor layer 130 through the first contact hole C1. In addition, the power line ELVDD may contact the second electrode 160 through the second contact hole C2. The power line ELVDD may have a single-layered or a multi-layered structure including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A fourth insulation layer 125 may be disposed on the power line ELVDD and the third insulation layer 124. The fourth insulation layer 125 may be in a form of a single layer such as a silicon nitride or a silicon oxide layer, or the like, or may be a double layer of a silicon nitride and a silicon oxide.

A pixel electrode 210, an emission layer 220, and a power source electrode 230 may be sequentially disposed on the fourth insulation layer 125. The emission layer 220 may include at least one of an organic light emitting material and an inorganic light emitting material. The pixel electrode 210, the emission layer 220, and the power source electrode 230 may form the light emitting diode LED. The pixel electrode 210 may be an anode of the light emitting diode LED and the power source electrode 230 may be a cathode of the light emitting diode LED. In some implementations, the pixel electrode 210 may be a cathode of the light emitting diode LED and the power source electrode 230 may be an anode of the light emitting diode LED. Holes and electrons may be injected from the pixel electrode 210 and the power source electrode 230, respectively, and an exciton generated by coupling the injected hole and electron may fall from an excited state to a ground state to emit light. The light emitting diode LED may emit light of one of primary colors or white light. The primary colors may exemplarily include red, green, and blue. In some implementations, the primary colors may include yellow, cyan, and magenta.

One of the pixel electrode 210 and the power source electrode 230 may be a reflective electrode and the other may be a transflective electrode. For example, in case of a top emission type of display device, the pixel electrode 210 may be a reflective electrode and the power source electrode 230 may be a transflective electrode. Light emitted from the emission layer 220 may be reflected by the pixel electrode 210 and thus may proceed in a direction of the power source electrode 230. A part of light incident on the power source electrode 230 may pass through the power source electrode 230 and thus may proceed toward a user. A remaining portion of the light may resonate between the pixel electrode 210 and the power source electrode 230 while proceeding in a direction of the pixel electrode 210.

An encapsulation layer, a cover window, and the like may be disposed on the light emitting diode LED to protect the light emitting diode LED.

Figure 2:
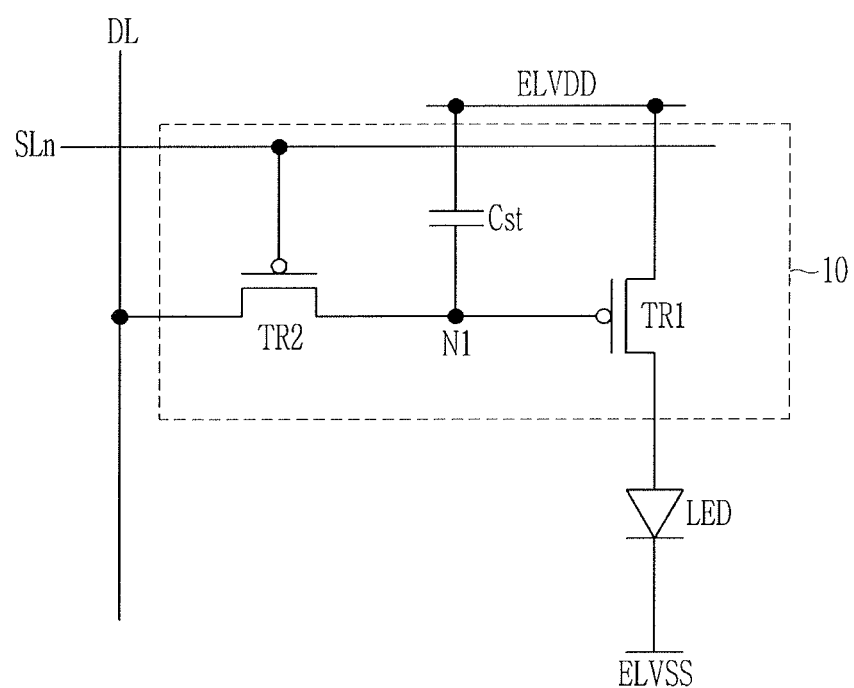
FIG. 2 illustrates a pixel according to the exemplary embodiment.

FIG. 2 illustrates a pixel according to the exemplary embodiment. Referring to FIG. 2, a pixel included in the display device may include a light emitting diode LED and a pixel circuit 10 that control a current flowing to the light emitting diode LED.

The pixel circuit 10 according to an exemplary embodiment may include a driving transistor TR1, a switching transistor TR2, and a storage capacitor Cst.

The driving transistor TR1 may include a gate electrode connected to a first node N1, a first end connected to the power line ELVDD, and a second end connected to the light emitting diode LED. The driving transistor TR1 may control an amount of current flowing to the light emitting diode LED from the power line ELVDD corresponding to a voltage of the first node N1.

The switching transistor TR2 may include a gate electrode connected to a scan line SLn, a first end connected to a data line DL, and a second end connected to the first node N1. The switching transistor TR2 may be turned on according to a scan signal of a gate-on voltage applied to the scan line SLn, and may transmit a data voltage applied to the data line DL to the first node N1.

The storage capacitor Cst may include a first end connected to the power line ELVDD and a second end connected to the first node N1. The storage capacitor Cst may serve to maintain the data voltage applied to the first node N1.

The light emitting diode LED may include an anode connected to the second end of the driving transistor TR1 and a cathode connected to a power source electrode ELVSS. The power source electrode ELVSS may correspond to the power source electrode 230 shown in FIG. 1.

The driving transistor described above with reference to FIG. 1 may correspond to the driving transistor TR1 of FIG. 2. The storage capacitor Cst described above with reference to FIG. 1 may correspond to the storage capacitor Cst of FIG. 2. The power line ELVDD described above with reference to FIG. 1 may correspond to the power source line ELVDD of FIG. 2. For example, the configuration in which the first end 131 of the semiconductor layer 130 is connected to the power line ELVDD and the second electrode 160 is connected to the power line ELVDD, as shown in FIG. 1, may correspond to a configuration in which the first end of the driving transistor TR1 and the first end of the storage capacitor Cst are connected to the power line ELVDD, as shown in FIG. 2.

As previously described with reference to FIG. 1, a driving range of the driving transistor TR1 for control of a current flowing to the light emitting diode LED from the power line ELVDD may be increased as a length of a channel of the driving transistor TR1 of FIG. 2 is increased. Accordingly, a luminance range of the light emitting diode LED may be increased. In addition, when the area of the capacitor Cst of FIG. 2 is widened, thereby increasing capacity thereof, the storage capacitor Cst may more strongly maintain the data voltage applied to the first node N1.

Hereinafter, a display device according to another exemplary embodiment will be described with reference to FIG. 3. Although FIG. 3 mainly illustrates differences from FIG. 1, it should be understood that the features illustrated in FIG. 1 may be applied to FIG. 3.

Figure 3:
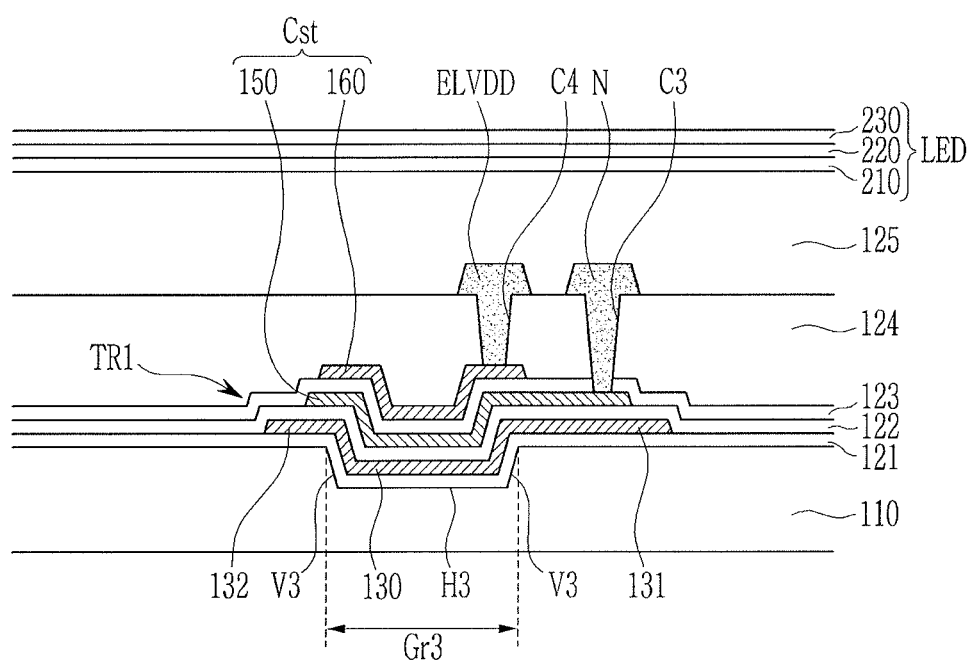
FIG. 3 illustrates a cross-sectional view of a display device according to another exemplary embodiment.

FIG. 3 illustrates a cross-sectional view of a display device according to another exemplary embodiment. Referring to FIG. 3, a display device may include a light emitting diode LED, a driving transistor TR1, and a storage capacitor Cst. The storage capacitor Cst may overlap the driving transistor TR1.

The substrate 110 may include a recess portion Gr3 that is in an overlapping relationship with the driving transistor TR1. The recess portion Gr3 may be in an overlapping relationship with the storage capacitor Cst.

The recess portion Gr3 may include a horizontal portion H3 and vertical portions V3. The horizontal portion H3 may be a portion that is formed substantially in a horizontal direction at a location that is lower than an upper surface of the substrate 110, excluding the recess portion Gr3. The vertical portions V3 may be portions that connect the upper surface of the substrate 110 and the horizontal portion 113 substantially in a vertical direction. The term "upper surface of the substrate 110" may refer to a portion excluding the recess portion G3 in one side of the substrate 110, and may be referred to as a non-recess portion. A thickness of the substrate 110 in the recess portion Gr3 may be less than the thickness of the substrate 110 in the non-recess portion.

A buffer layer 121 may be disposed on the substrate 110. The buffer layer 121 may form protrusions and depressions conforming to the shape of the recess portion Gr3.

A semiconductor layer 130 that includes amorphous silicon, polysilicon, or an oxide semiconductor may be disposed on the buffer layer 121. The semiconductor layer 130 may overlap the recess portion Gr3, and may be formed wider than the recess portion Gr3 in the horizontal direction. A portion of the semiconductor layer 130 may be disposed on the recess portion Gr3 and another portion thereof may be disposed on the non-recess portion. The semiconductor layer 130 may include protrusions and depressions conforming to a shape of the recess portion Gr3. A first end 131 and a second end 132 of the semiconductor layer 130, spaced apart from each other, may be doped with an impurity and thus may have conductivity. A channel region may be located between the first end 131 and the second end 132. The channel region of the semiconductor layer 130 may include protrusions and depressions having vertical portions and horizontal portion conforming to the shape of the recess portion Gr3.

A first insulation layer 122 may be disposed on the semiconductor layer 130 and the buffer layer 121.

A first conductive layer is disposed on the first insulation layer 122. The first conductive layer may include a gate electrode 150 that overlaps the recess portion Gr3. The gate electrode 150 may include protrusions and depressions having vertical portions and horizontal portion conforming to the shape of the recess portion Gr3. The gate electrode 150 may be formed to be wider than the recess portion Gr3 in the horizontal direction. A part of the gate electrode 150 may be disposed on the recess portion Gr3 and another part thereof may be disposed on the non-recess portion. The gate electrode 150 may overlap the channel region of the semiconductor layer 130. The gate electrode 150 and the semiconductor layer 130 may form the driving transistor TR1.

When the channel region of the semiconductor layer 130 include the protrusions and depressions having vertical portions and horizontal portion conforming to the shape of the recess portion Gr3, the length of the channel may be increased corresponding to a length of a vertical portions V3 of the recess portion Gr3.

A second insulation layer 123 may be disposed on the gate electrode 150 and the first insulation layer 122.

A second conductive layer may be disposed on the second insulation layer 123. The second conductive layer may include a second electrode 160 that overlaps the recess portion Gr3. The second electrode 160 may include protrusions and depressions having vertical portions and horizontal portion conforming to the shape of the recess portion Gr3. In some implementations, the second electrode 160 is not wider than the recess portion Gr3 in the horizontal direction. In some implementations, the second electrode 160 may be formed to be wider than the recess portion Gr3 in the horizontal direction. A part of the second electrode 160 may be disposed on the recess portion Gr3 and another part thereof may be disposed on the non-recess portion.

The second electrode 160 may face the gate electrode 150, with the second insulation layer 123 interposed therebetween. The gate electrode 150 and the second electrode 160 may form a storage capacitor Cst. For example, the gate electrode 150 may serve as the above-described first electrode 140 of the storage capacitor Cst of FIG. 1. The gate electrode 150 may be shared as a first electrode of the storage capacitor Cst. When each of the gate electrode 150 and the second electrode 160 form protrusions and depressions having vertical portions and horizontal portion conforming to the shape of the recess portion Gr3, the area of the storage capacitor Cst may be increased corresponding to a second vertical portions V2 of the recess portion Gr3. Capacity of the storage capacitor Cst may correspond (i.e., may be proportionate) to the length of the vertical portions and the length of the horizontal portion of the gate electrode 150 and the second electrode 160.

A third insulation layer 124 may be disposed on the second electrode 160 and the second insulation layer 123.

A third conductive layer may be disposed on the third insulation layer 124. The third conductive layer may include a power line ELVDD and a node line N. A third contact hole C3 may be located to overlap a first end of the gate electrode 150. The third contact hole C3 may penetrate the second insulation layer 123 and the third insulation layer 124. A fourth contact hole C4 may be located to overlap one end of the second electrode 160. The fourth contact hole C3 may penetrate the third insulation layer 124. The node line N may contact the gate electrode 150 through the third contact hole C3. The power line ELVDD may contact the second electrode 160 through the fourth contact hole C4. The node line N may be a line connected to the first node N1, which is exemplarily illustrated in FIG. 2. The first node N1 may be connected to the second switching transistor TR of FIG. 2 through the node line N.

A fourth insulation layer 125 may be disposed on the power line ELVDD, the node line N, and the third insulation layer 124, and a pixel electrode 210, an emission layer 220, and a power source electrode 230 may be sequentially disposed on the fourth insulation layer 125.

The driving transistor TR1 of FIG. 3 may correspond to the driving transistor TR1 of FIG. 2, the storage capacitor Cst of FIG. 3 may correspond to the storage capacitor Cst of FIG. 2, and the power line ELVDD of FIG. 3 may correspond to the power line ELVDD of FIG. 2.

Hereinafter, referring to FIG. 4, an example of capacitance variation with respect to an area of the storage capacitor Cst will be described. Referring to FIG. 5, an example of a driving range of the driving transistor TR1 with respect to a channel length of the driving transistor TR1 will be described.

Figure 4:
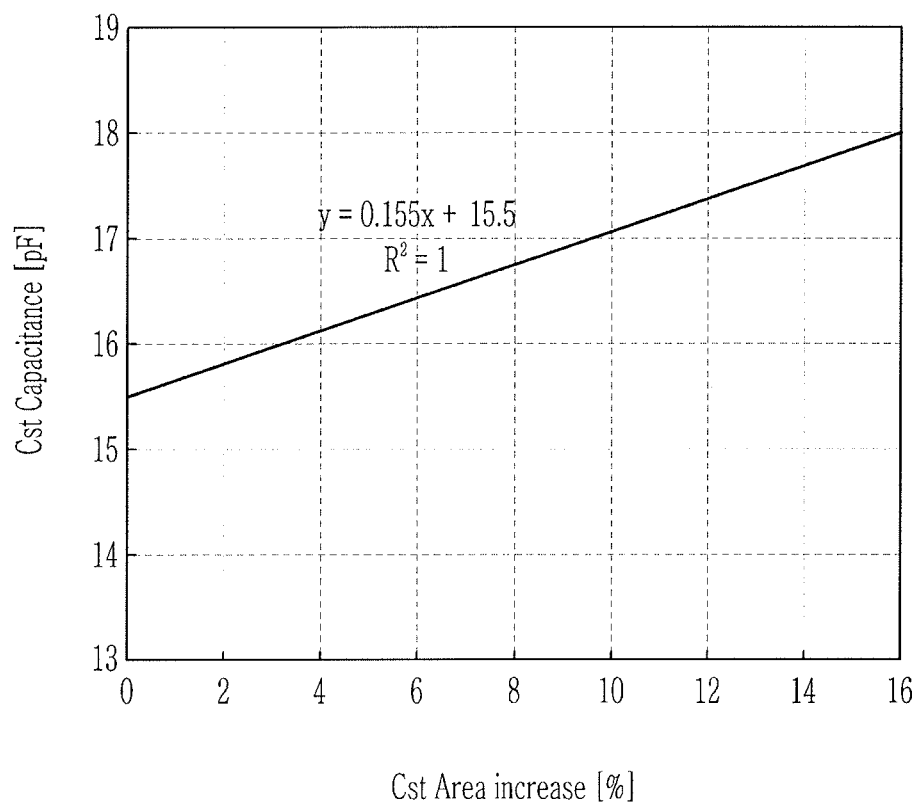
FIG. 4 illustrates a graph that shows capacity variation with respect to an area of a storage capacitor.
Figure 5:
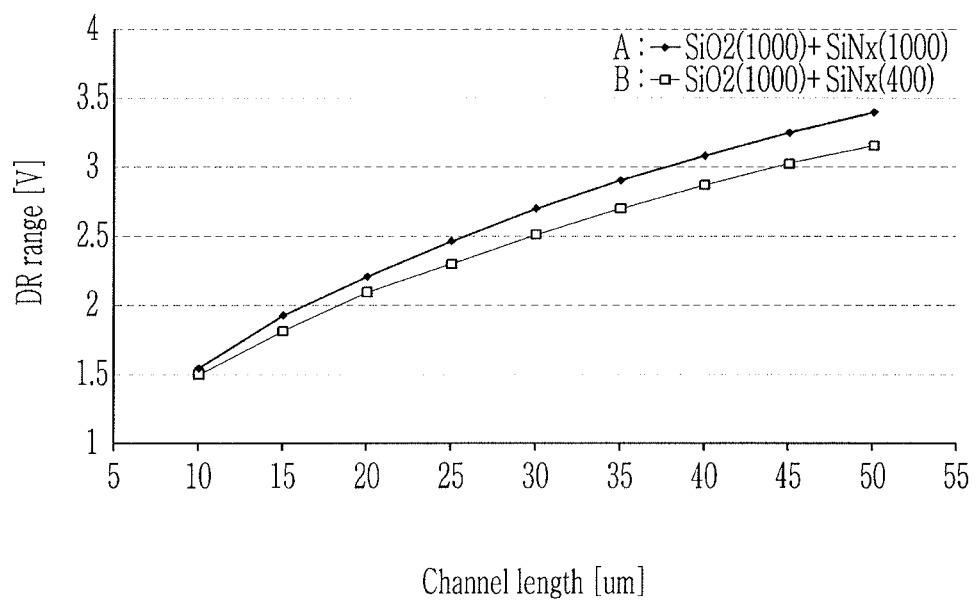
FIG. 5 illustrates a graph that shows a driving range of a driving transistor with respect to a channel length of the driving transistor.

FIG. 4 illustrates a graph that shows capacitance variation with respect to the area of the storage capacitor. Referring to FIG. 4, the graph shows a result of a simulation of variation of capacitance pF of the storage capacitor Cst with respect to a ratio (%) of an area increase of the storage capacitor Cst. It may be observed through the graph that the capacitance pF of the storage capacitor Cst is linearly increased as the area of the storage capacitor Cst is increased.

FIG. 5 illustrates a graph that shows a driving range of the driving transistor with respect to the channel length of the driving transistor. Referring to FIG. 5, the graph shows a result of an experiment measuring a driving range V of the driving transistor TR1 with respect to a channel length of the driving transistor TR1. A driving range V may be a range of a gate voltage corresponding to a minimum amount and a maximum amount of a current that can be flowed by the driving transistor TR1.

In the experiment, a driving range V with a channel length of the driving transistor TR1 of which a thickness of the semiconductor layer 130 was 1,000 angstroms and a thickness of the insulation layer between the gate electrode 150 and the semiconductor layer 130 was 1,000 angstroms was measured (Case A). In addition, a driving range V with a channel length of the driving transistor TR1 of which a thickness of the semiconductor layer 130 was 400 angstroms and a thickness of the insulation layer between the gate electrode 150 and the semiconductor layer 130 was 1,000 angstroms was measured (Case B).

It can be observed through the experiment that the driving range V of the driving transistor TR1 was increased as the channel length of the driving transistor TR1 was increased in both of the cases A and B.

Figure 6:
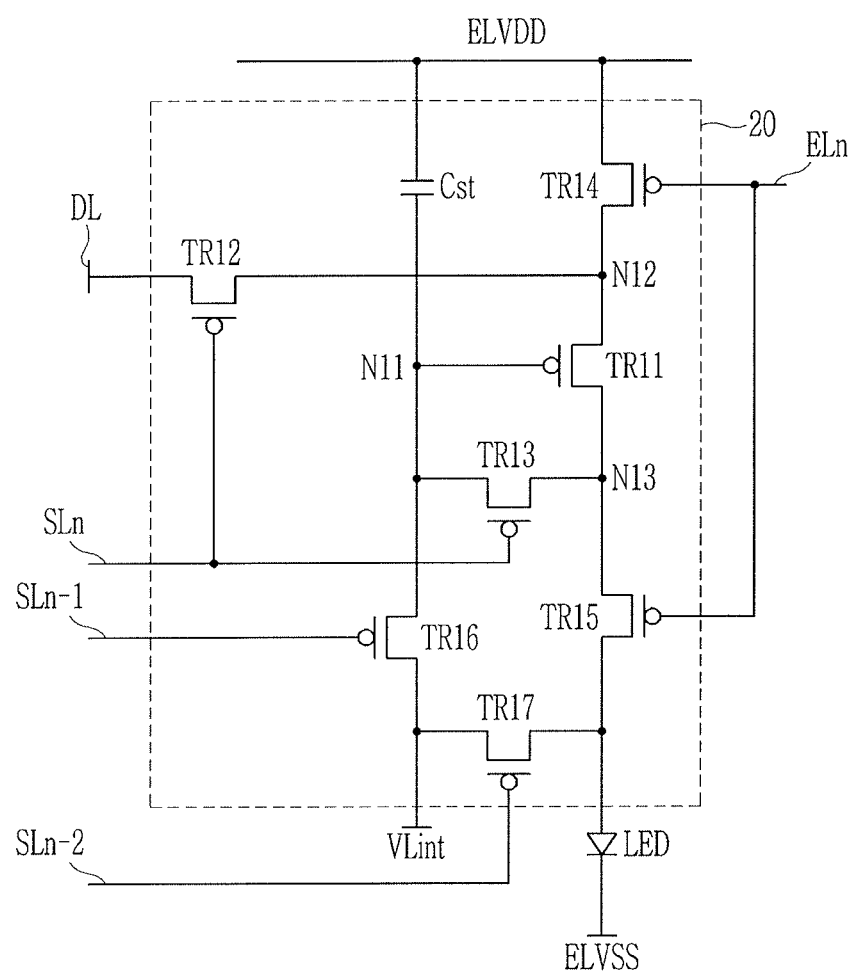
FIG. 6 illustrates a pixel according to another exemplary embodiment.

FIG. 6 illustrates a pixel according to an exemplary embodiment.

Referring to FIG. 6, a pixel included in a display device may include a light emitting diode LED and a pixel circuit 20 that controls a current flowing to the light emitting diode LED.

The pixel circuit 20 according to an exemplary embodiment may include a driving transistor TR11, a switching transistor TR12, a compensation transistor TR13, a first light emission control transistor TR14, a second light emission control transistor TR15, a first initialization transistor TR16, a second initialization transistor TR17, and a storage capacitor Cst.

The driving transistor TR11 may include a gate electrode connected to a first node N11, a first end connected to a second node N12, and a second end connected to a third node N13. The driving transistor TR11 may control a current amount flowing to the light emitting diode LED from a power line ELVDD corresponding to a voltage of the first node N11.

The switching transistor TR12 may include a gate electrode connected to a first scan line SLn, a first end connected to a data line DL, and a second end connected to the second node N12. The switching transistor TR12 may be turned on according to a first scan signal of a gate-on voltage applied to the first scan line SLn, and may transmit a data voltage applied to the data line DL to the second node N12.

The compensation transistor TR13 may include a gate electrode connected to the first scan line SLn, a first end connected to the third node N13, and a second end connected to the first node N11. The compensation transistor TR13 may be turned on according to a scan signal of a gate-on voltage applied to the first scan line SLn, and may compensate a threshold voltage of the driving transistor TR11 by diode-connecting the driving transistor TR11.

The first light emission control transistor TR14 may include a gate electrode connected to a light emission control line ELn, a first end connected to a power line ELVDD, and a second end connected to the second node N12.

The second light emission control transistor TR15 may include a gate electrode connected to the light emission control line ELn, a first end connected to the third node N13, and a second end connected to the light emitting diode LED. The first and second light emission control transistors TR14 and TR15 may be turned on according to a light emission control signal of a gate-on voltage applied to the light emission control line ELn, and may enable a current to flow to the light emitting diode LED through the driving transistor TR11 from the power line ELVDD.

The first initialization transistor TR16 may include a gate electrode connected to a second scan line SLn−1, a first end connected to an initialization voltage line VLint, and a second end connected to the first node N11. The first initialization transistor TR16 may be turned on by a second scan signal of a gate-on voltage applied to the second scan line SLn−1, and thus may initialize a gate voltage of the driving transistor TR11 by transmitting an initialization voltage of the initialization voltage line VLint to the first node N11.

The second initialization transistor TR17 may include a gate electrode connected to a third scan line SLn−2, a first end connected to the initialization voltage line VLint, and a second end connected to an anode of the light emitting diode LED. The second initialization transistor TR17 may be turned on by a third scan signal of a gate-on voltage applied to the third scan line SLn−2, and thus may initialize the light emitting diode LED by transmitting the initialization voltage of the initialization voltage line VLint to the anode of the light emitting diode LED.

The storage capacitor Cst may include a first end connected to the power line ELVDD and a second end connected to the first node N11. The first node N11 may be applied with a data voltage that is compensated from a threshold voltage of the driving transistor TR11. The storage capacitor Cst may maintain a voltage of the first node N11.

The light emitting diode LED may include an anode connected to the second end of the second light emission control transistor TR15 and a cathode connected to a power source electrode ELVSS.

The driving transistor TR1 described with reference to FIG. 3 may correspond to the driving transistor TR11 of FIG. 6. The storage capacitor Cst described with reference to FIG. 3 may correspond to the storage capacitor Cst of FIG. 6. The power line ELVDD described with reference to FIG. 3 may correspond to the power line ELVDD of FIG. 6. The node line N described with reference to FIG. 3 may be a line connected to the first node N11 of FIG. 6, and thus may be connected to the compensation transistor TR13.

When a channel length of the driving transistor TR11 is increased, a driving range of the driving transistor TR11 for controlling a current flowing to the light emitting diode LED from the power line ELVDD can be increased, thereby increasing a luminance range of the light emitting diode LED. In addition, as the area of the storage capacitor Cst is increased, the storage capacitor Cst can strongly maintain the voltage applied to the first node N11.

By way of summation and review, a display device such a light emitting diode includes a driving transistor that controls a current amount flowing to the light emitting diode and a storage capacitor that maintains a gate voltage of the driving transistor.

When a driving range of a driving transistor is increased, a current flowing to a light emitting diode may be easily controlled. When a capacitance of a storage capacitor is increased, light emission of the light emitting diode may be more stably maintained. However, an area allocated to each of a plurality of pixels is reduced as resolution of the display device is increased. Accordingly, an area for alignment of the driving transistor or the storage capacitor is reduced. As a result, the driving range of the driving transistor may be reduced and capacitance of the storage capacitor may be decreased.

Embodiments provide a display device in which a driving range of a driving transistor and capacitance of a storage capacitor, which are included in each of a plurality of pixels, are increased. Accordingly, a color expression range may be improved and the display device may more stably emit light Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
a substrate including a first recess portion;
a buffer layer on the substrate that overlaps the first recess portion, the buffer layer including protrusions and depressions conforming to a shape of the first recess portion;
a semiconductor layer on the buffer layer, the semiconductor layer overlapping the first recess portion and including protrusions and depressions conforming to the shape of the first recess portion; and
a gate electrode on the semiconductor layer to control the semiconductor layer, the gate electrode overlapping the first recess portion and the semiconductor layer, the gate electrode including protrusions and depressions conforming to the shape of the first recess portion, and the gate electrode having no electrically connected electrode under the semiconductor layer, wherein
a thickness of the substrate in the first recess portion is less than a thickness of the substrate in a non-recess portion, excluding the first recess portion.

2. The display device as claimed in claim 1, further comprising a light emitting diode, wherein
the semiconductor layer and the gate electrode form a driving transistor that controls an amount of a current flowing to the light emitting diode.

3. The display device as claimed in claim 2, wherein:
the semiconductor layer includes a first end and a second end that are spaced apart from each other, and a channel region that is located between the first end and the second end, and
the channel region includes protrusions and depressions having vertical portions and a horizontal portion, the vertical portions and the horizontal portion conforming to the shape of the first recess portion.

4. The display device as claimed in claim 3, wherein a channel length of the driving transistor corresponds to a length of the vertical portions and a length of the horizontal portion of the channel region.

5. The display device as claimed in claim 2, further comprising:
a second recess portion in the substrate;
a first electrode that overlaps the second recess portion, the first electrode including protrusions and depressions conforming to a shape of the second recess portion; and
a second electrode that overlaps the second recess portion and faces the first electrode, the second electrode including protrusions and depressions conforming to the shape of the second recess portion.

6. The display device as claimed in claim 5, wherein the first electrode and the second electrode form a storage capacitor that maintains a gate voltage of the driving transistor.

7. The display device as claimed in claim 6, wherein:
the first electrode and the second electrode respectively include protrusions and depressions having vertical portions and a horizontal portion conforming to the shape of the second recess portion, and
the storage capacitor has a capacitance corresponds to a length of the vertical portions and a length of the horizontal portion.

8. The display device as claimed in claim 2, further comprising a second electrode that overlaps the first recess portion, the semiconductor layer, and the gate electrode, wherein
the gate electrode and the second electrode form a storage capacitor that maintains a gate voltage of the driving transistor.

9. The display device as claimed in claim 8, wherein:
the gate electrode and the second electrode respectively include protrusions and depressions having vertical portions and a horizontal portion conforming to the shape of the first recess portion, and
the storage capacitor has a capacitance that corresponds to a length of the vertical portions and a length of the horizontal portion.

10. A display device, comprising:
a substrate including a recess portion;
a buffer layer on the substrate that overlaps the recess portion, the buffer layer including protrusions and depressions conforming to a shape of the recess portion;
a first electrode on the buffer layer and made of an electrically conductive metal, the first electrode overlapping the recess portion and including protrusions and depressions conforming to the shape of the recess portion;
a second electrode above the first electrode and that overlaps the recess portion and faces the first electrode, the second electrode including protrusions and depressions conforming to the shape of the recess portion; and an insulation layer that is between the first electrode and the second electrode, wherein a thickness of the substrate in the recess portion is less than a thickness of the substrate in a non-recess portion, excluding the recess portion.

11. The display device as claimed in claim 10, further comprising:

a light emitting diode; and a driving transistor that controls an amount of a current flowing to the light emitting diode, wherein the first electrode and the second electrode form a storage capacitor that maintains a gate voltage of the driving transistor.

12. The display device as claimed in claim 11, wherein:

the first electrode and the second electrode respectively include protrusions and depressions having vertical portions and a horizontal portion conforming to the shape of the recess portion, and capacitance of the storage capacitor corresponds to a length of the vertical portions and a length of the horizontal portion.

13. The display device as claimed in claim 10, further comprising:

an additional recess portion formed in the substrate; and a semiconductor layer that overlaps the additional recess portion, the semiconductor layer including protrusions and depressions conforming to a shape of the additional recess portion; and a gate electrode that overlaps the additional recess portion and the semiconductor layer, and forms protrusions and depressions conforming to the shape of the additional recess portion, wherein:

the semiconductor layer includes a first end and a second end that are spaced apart from each other, and a channel region that is located between the first end and the second end, and the semiconductor layer and the gate electrode form a driving transistor that controls an amount of a current flowing to a light emitting diode.

14. The display device as claimed in claim 13, wherein:

the channel region includes protrusions and depressions having vertical portions and a horizontal portion conforming to the shape of the additional recess portion, and a channel length of the driving transistor corresponds to a length of the vertical portions and a length of the horizontal portion of the channel region.

15. The display device as claimed in claim 10, further comprising:

a driving transistor that controls an amount of a current flowing to a light emitting diode, wherein a channel region of the driving transistor is on a different layer than the first electrode.

16. A display device, comprising:

a substrate;

a first recess portion in the substrate;

a buffer layer on the substrate that overlaps the first recess portion, the buffer layer including protrusions and depressions conforming to a shape of the first recess portion;

a semiconductor layer on the buffer layer;

a light emitting diode on the buffer layer;

a driving transistor that includes a channel region overlapping the first recess portion and that controls an amount of a current flowing to the light emitting diode;

a gate electrode on the semiconductor layer to control the semiconductor layer, the gate electrode overlapping the first recess portion and the semiconductor layer, the gate electrode having no electrically connected electrode under the semiconductor layer, wherein a thickness of the substrate in the first recess portion is less than a thickness of the substrate in a non-recess portion, excluding the first recess portion.

17. The display device as claimed in claim 16, wherein:

the channel region of the driving transistor includes vertical portions and a horizontal portion that conform to a shape of the first recess portion, and a channel length of the driving transistor corresponds to a length of the vertical portions and a length of the horizontal portion.

18. The display device as claimed in claim 16, further comprising:

a second recess portion in the substrate; and a storage capacitor that includes a first electrode and a second electrode overlapping the second recess portion, wherein the storage capacitor maintains a gate voltage of the driving transistor.

19. The display device as claimed in claim 18, wherein:

each of the first electrode and the second electrode includes vertical portions and a horizontal portion conforming to a shape of the second recess portion, and capacitance of the storage capacitor corresponds to a length of the vertical portions and a length of the horizontal portion.

20. The display device as claimed in claim 16, further comprising a storage capacitor that overlaps the first recess portion and the driving transistor.

21. The display device as claimed in claim 20, wherein a gate electrode of the driving transistor is shared as a first electrode of the storage capacitor.

* * * * *